(12) United States Patent
Hasse et al.

(10) Patent No.: US 9,160,338 B2
(45) Date of Patent: Oct. 13, 2015

(54) ADAPTIVE INTERFACE FOR COUPLING FPGA MODULES

(71) Applicant: dSPACE digital signal processing and control engineering GmbH, Paderborn (DE)

(72) Inventors: Dirk Hasse, Salzkotten (DE); Robert Polnau, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 14/275,284

(22) Filed: May 12, 2014

(65) Prior Publication Data

US 2014/0333344 A1 Nov. 13, 2014

(30) Foreign Application Priority Data

May 10, 2013 (EP) .................................... 13167208

(51) Int. Cl.
| | |
|---|---|
| H03K 19/173 | (2006.01) |
| H03K 19/177 | (2006.01) |
| G06F 7/38 | (2006.01) |
| H03K 19/0175 | (2006.01) |
| G06F 13/42 | (2006.01) |

(52) U.S. Cl.
CPC .... *H03K 19/017509* (2013.01); *G06F 13/4291* (2013.01); *H03K 19/0175* (2013.01); *H03K 19/17732* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 7,177,709 B2 | 2/2007 | Uhlendorf et al. | |
| 7,268,582 B1 | 9/2007 | Zheng et al. | |
| 2011/0320765 A1* | 12/2011 | Karkhanis et al. | 712/7 |
| 2012/0051473 A1* | 3/2012 | Mayer et al. | 375/346 |
| 2013/0041550 A1 | 2/2013 | Dressler et al. | |

FOREIGN PATENT DOCUMENTS

| | | |
|---|---|---|
| DE | 203 07 308 U1 | 8/2003 |
| DE | 10 2011 052 512 A1 | 2/2013 |
| EP | 1 168 187 A1 | 1/2002 |
| JP | 4-322347 | 11/1992 |

* cited by examiner

*Primary Examiner* — Jany Richardson
(74) *Attorney, Agent, or Firm* — Muncy, Geissler, Olds & Lowe, P.C.

(57) ABSTRACT

A method for implementing an adaptive interface between at least one FPGA with at least one FPGA application and at least one I/O module, which are designed as the corresponding sender side or receiver side, for connection to the FPGA, whereby a serial interface is formed between the at least one FPGA and the at least one I/O module, comprising the steps of configuring a maximum number of registers to be transmitted for each FPGA application, configuring a shared, fixed register width for all registers, setting an enable signal on the sender side for the registers to be transmitted out of the maximum number of registers to be transmitted, transmitting the enable signal from the sender side to the receiver side, and transmitting the registers, for which the enable signal is set, from the sender side to the receiver side.

15 Claims, 4 Drawing Sheets

ADAPTIVE INTERFACE FOR COUPLING FPGA MODULES

This nonprovisional application claims priority to European Application No EP 13167208.1, which was filed on May 10, 2013, and is herein incorporated by reference.

BACKGROUND OF THE INVENTION

1. Field of the Invention

The present invention relates to a method for implementing an interface between at least one FPGA with at least one FPGA application and at least one I/O module, which are designed as a corresponding sender side or receiver side, for connection to the FPGA. Further, the invention relates to an FPGA control system with at least one FPGA with at least one FPGA application and at least one I/O module, which are designed as the corresponding sender side or receiver side, for connection to the FPGA.

2. Description of the Background Art

Shorter cycle times of control circuit models are increasingly required in high-end applications. For this reason, such control circuit models based on control algorithms are often implemented in FPGA control systems in field programmable gate arrays (FPGAs), as a result of which very rapid control circuits with sampling rates of 100 ns to 5 μs can be implemented. The control circuit models can be designed as modular. These modular FPGA circuits or model FPGA circuits in prototyping systems usually do not have suitable I/O wiring, in order to be able to operate directly the necessary sensors and/or actuators.

Thus, an adaptation for the sensors and/or actuators is necessary, which occurs via I/O modules. The I/O modules can produce, for example, a connection to the model hardware via a connector system, i.e., the FPGA, whereby direct connectors for attaching the I/O modules or cable connectors can be used.

It is problematic in such a modular system to connect any I/O modules with a low latency and high bandwidth to the model FPGA.

In order to solve this problem, defining a suitable interface with a suitable protocol for each specific I/O module is known from the state of the art. As a result, a low latency at the highest bandwidth possible can be achieved. Nevertheless, each defined interface must be set up specifically both on the side of the FPGA application and for the particular I/O module, which is associated with a high cost.

Alternatively, implementing modular buses, which usually have a fixed maximum attainable bandwidth and latency, is known from the state of the art. Different modular systems are known in which the connection occurs via address data buses. In this regard, a distinction is made in principle between parallel buses, e.g., PHS bus or ISA bus, and serial buses, e.g., PCI Express.

In the case of parallel buses, the bandwidth is usually determined by the number of available data lines. In a bus with N data lines, the latency is identical during the transmission of 1 or N bits. The maximum achievable bandwidth and latency are identical for all I/O modules.

In the case of serial buses for modular systems, a protocol is used in which the actual payloads are embedded. These known protocols have a minimum protocol overhead, which independently is identical for the transmission of, for example, 1 bit or 32 bits, when a minimum payload amount is established by the protocol. For example, only n*bytes (8 bits) or n*32 bits can always be transmitted. If only one payload bit is to be transmitted, nonetheless, the complete minimum payload volume must be transmitted. The bandwidth and the latency deteriorate because of the protocol overhead and the minimum payload volume in comparison with a specific implementation of the interface.

A constant data rate may also be necessary depending on the employed FPGA models. Deviations from the constant date rate are called jitter.

The above statements each refer to a sender and receiver side, i.e., a unidirectional interface. Implementation of the FPGA application and of the I/O module as a sender or receiver side is thereby interchangeable. Moreover, the interface can also be designed as a bidirectional interface.

SUMMARY OF THE INVENTION

It is therefore an object of the present invention to provide a method and an FPGA control system, which enable a variable data transmission between the sender and receiver side with a desired data rate and a desired latency with the provision of a high data rate and a low latency and are to be carried out or provided at low cost.

According to an embodiment of the invention, a method is provided for implementing an adaptive interface between at least one FPGA with at least one FPGA application and at least one I/O module, which are designed as the corresponding sender side or receiver side, for connection to the FPGA. A serial interface is formed between the at least one FPGA and the at least one I/O module. The method comprises the steps of configuring a maximum number of registers to be transmitted for each FPGA application, configuring a shared, fixed register width for all registers, setting an enable signal on the sender side for the registers to be transmitted out of the maximum number of registers to be transmitted, transmitting the enable signal from the sender side to the receiver side, transmitting the registers for which the enable signal is set from the sender side to the receiver side.

According to an embodiment of the invention, furthermore, an FPGA control system is provided with at least one FPGA with at least one FPGA application and at least one I/O module, which are designed as the corresponding sender side or receiver side, for connection to the FPGA. A serial interface is formed between the at least one FPGA and the at least one I/O module. The FPGA control system is designed for implementing an adaptive interface between the at least one FPGA and the at least one I/O module according to the above method.

In an embodiment, an idea of the is to enable a simple implementation by providing an adaptive interface between the FPGA application and the I/O module, in that standard implementations are used and in each case can be configured for the desired needs. Due to the configuration, only the data relevant to the specific application of an I/O function are transmitted by the adaptive interface. Due to the configuration of the maximum number of registers to be transmitted for each FPGA application and the shared, fixed register width, a simple adaptation of FPGA applications and I/O modules to different FPGA functions can occur in order to provide high-efficiency control and regulating systems in a simple manner.

The configuring of a maximum number of registers to be transmitted for each FPGA application and the configuring of a shared, fixed register width for all registers comprises the selection of a number of maximum registers to be transmitted for each FPGA model and a maximum number, to be transmitted, of register bits. This configuration can be a global configuration for all FPGA applications. The FPGA model in this case relates to the totality of all FPGA applications, whereby the FPGA model may have a plurality of individual models.

The setting of the enable signal on the sender side causes the non-transmission of data from unused registers, as a result of which the available bandwidth can be used efficiently. Moreover, bandwidth utilization can be adapted dynamically, so that a low latency can be achieved for small data volumes. Thus, the provision of high data rates as well as a low latency can be realized with the same adaptive interface. Accordingly, both applications with the lowest latency in a few channels and also those with a high channel number can be realized reliably and in a simple manner. In this regard, only a few configuration parameters need to be preset, as a result of which the utilization of the adaptive interface is possible in a simple and convenient manner.

The number of registers implemented in the FPGA at the FPGA code generation time is determined by the requirements of the specifically selected I/O function of the FPGA model and/or of the I/O module. FPGA resources, necessary for implementing the I/O function, can be adapted by means of the configuration. In statically defined enable signals, the FPGA resources can be optimized further with the help of the unused registers. If, for example, only one register is needed, the FPGA resources are reduced to a minimum. The number of bits in the registers of an FPGA application is equivalent here to the inputs of the sender side.

The enable signals in a transmission direction from the FPGA application to the I/O module can be automatically activated as soon as a data channel is used in the underlying FPGA model. The same applies to the enable signals in a transmission direction from the I/O module to the FPGA application, which can be set automatically by implementing the I/O module in the FPGA model.

Unused bits in registers can be set to a constant value. The handling is facilitated by this predefined value.

The serial interface can be realized as an LVDS interface, which enables a high data transmission rate. The bandwidth can be increased flexibly by the parallel connection of a plurality of LVDS interfaces. The LVDS interface for transmitting data blocks can be realized with a fixed length, for example, 8 bits. The length of the data blocks of the LVDS interface is configured as a configuration setting. The number of bits in a register can be selected in such a way that, together with a signaling overhead, it is a multiple of the length of the data block of the LVDS interface. For example, each register may comprise 34 bits, which together with the 6 bit overhead are transmitted in a total of five data blocks of the LVDS interface.

The employed physical interface between the FPGA and the I/O module, i.e., the serial interface, is therefore abstracted by a higher protocol. Abstracted components of the higher protocol can be integrated simply into other modules and models, for example, per blockset or IP cores and/or netlists. The adaptive interface because of the generics permits the coupling of different I/O modules. In this regard, it is only necessary that the configuration of the interface is the same. A corresponding configuration of the interface can occur initially for all I/O modules, which can assure the shared use. Typically, a plurality of registers of the FPGA in each case maps a port.

The above statements refer in each case to a sender and receiver side, i.e., a unidirectional interface. Implementation of the FPGA application and of the I/O module as a sender or receiver side is thereby interchangeable. Moreover, the interface can also be designed as a bidirectional interface.

In an embodiment of the invention, the transmission of the registers, for which the enable signal is set, from the sender side to the receiver side comprises providing a strobe signal on the sender side in order to indicate that the registers to be transmitted are ready for transmission. The strobe signal can be set on the sender side by the model in order to indicate that the data in the registers are consistent and a transmission can be started. The strobe signal can be designed as a single bit. The strobe signal signals to the sender side the presence of data in the registers for transmission over the serial interface. Thus, these data can be read out and transmitted beginning with the strobe signal on the sender side in order to write them in the appropriate register on the receiver side. The sender side based on the strobe signal can safely assume that all registers are transmitted data-consistent to one another. In principle, synchronization of a plurality of I/O modules can occur by the strobe signal.

In an embodiment of the invention, the transmission of the registers, for which the enable signal is set, from the sender side to the receiver side comprises providing a ready signal on the sender side in order to indicate that the transmission of the registers to the receiver side has been completed. The successful completion of the transmission is signaled via the ready signal, therefore, on the sender side to the FPGA model, so that it can refill the registers for a transmission of further data. The completion of the transmission is therefore associated with the readiness for a new transmission. The ready signal can be configured as a single bit. If data from the registers are to be sent from the sender side, the status of the ready signal is checked first. If a transmission is already running, this is indicated by the missing ready signal, and a data transmission is not possible. The ready signal can be activated only after the interface has been initialized; i.e., at least the enable signals have been transmitted from the sender side to the receiver side. As soon as the ready signal permits the sending of data, the FPGA application initiates the transmission. As a result, the interface can begin a data transmission with a low latency from an idle state in which no data transmission occurs.

In an embodiment of the invention, the transmission of the registers, for which the enable signal is set, from the sender side to the receiver side comprises providing a ready signal on the receiver side in order to indicate that the receiving of the registers from the sender side has been completed. As a result, on the receiver side a specific hardware implementation can read out the data designated for it from the transmitted registers. A delay in the reading is prevented, so that a subsequent transmission of further data is not delayed either.

The implementation of the strobe and/or ready signal can occur arbitrarily as a high or low level, i.e., as zero or one.

In an embodiment of the invention, the transmission of the registers, for which the enable signal is set, from the sender side to the receiver side comprises the omission of equal leading bits of each register. Thus, the overall data volume to be transmitted can be reduced by the number of equal leading bits. In principle, an implementation can be selected which as needed detects and omits leading zeros or ones as equal leading bits; i.e., in an implementation leading ones are detected as equal leading bits, whereas in another implementation leading zeros are detected as equal leading bits. On the receiver side, bits that have not been received, i.e., the omitted bits, can be supplemented as bits with the value of the equal leading bits. The type of the equal leading bits can be configured.

Alternatively, a complete register can be transmitted, which can be signaled via a corresponding control signal for each individual register.

In an embodiment of the invention, the omission of equal leading bits of each register comprises the omission of predefined register sections with equal leading bits. Therefore, only equal leading bits are omitted when the entire register section contains the equal leading bits. Therefore, a number of leading bits which corresponds to a length of the register section must be equal in order to omit the transmission of these leading bits. The length of the predefined register sections can be selected so that it corresponds to the length of the transmission blocks of the serial interface. The length of the predefined registers sections can be selected so that it corresponds to the length of the transmission blocks of the LVDS interface. In this regard, the length of the register sections can be selected so that the length of the register section together with a signaling overhead corresponds to the length of a transmission block. A transmission block is used thereby completely or substantially completely for a predefined register section. The size of the predefined register sections can be defined as a global value, or be adapted dynamically during the execution of the FPGA model. As a result, the data transmission can be accelerated in that the transmission blocks of the serial interface are reduced.

Alternatively, a complete register section can be transmitted, which can be signaled via a corresponding control signal for each individual register section.

In an embodiment of the invention, the transmission of the registers, for which the enable signal is set, from the sender side to the receiver side comprises the addition of a leading bit as an unequal bit. This forces the transmission of the entire register, so that the interface operates at a constant data rate. Accordingly, data transmission jitter can be reduced or prevented.

In an embodiment of the invention, the transmission of the registers, for which the enable signal is set, from the sender side to the receiver side comprises the checking of registers, for which the enable signal is set, for changed contents and the transmission of registers with the changed contents. In principle, the changed registers can be transmitted as in the present case. However, only the changes are transmitted. Thus, in cases in which the bits of a register have not been changed, the change is transmitted, for example, as zero, whereas a changed bit is transmitted, for example, as one. In combination with an omission of the transmission of equal leading bits, zeros in the present case the transmission of unchanged register contents can therefore also be omitted in any coding with zeros and ones. Thereby, for example, in a system with rarely changing signals which represent leading bits, a reduction of the data to be transmitted is made possible even if this signal does not correspond to the equal bit, i.e., zero or one. Thus, not all bits of the register need to be transmitted because of an unequal leading bit.

In an embodiment of the invention, the method comprises the synchronization of register contents on the sender and receiver side. The synchronization can occur periodically, within time limits, and/or event-related in order to assure or to check the integrity of the data on the receiver side. To this end, the data are transmitted as they exist in the register; i.e., the registers are transmitted completely. This is signaled by a corresponding control signal for each individual register. During normal operation, changes in the register contents can be transmitted, whereby the synchronization assures the integrity of the register contents, i.e., the comparison of the register contents of the sender side and the receiver side. The synchronization can be carried out periodically.

In an embodiment of the invention, the setting on the sender side of an enable signal for registers to be transmitted out of the maximum number of registers to be transmitted comprises a dynamic setting of the enable signal before the transmission of the registers, and the transmission of the enable signal from the sender side to the receiver side occurs in each case before the transmission of the registers. For example, the enable signal can be transmitted before each data transmission to the receiver side. A high flexibility of the adaptive interface is achieved as a result.

In an embodiment of the invention, the setting on the sender side of an enable signal for registers to be transmitted out of the maximum number of registers to be transmitted comprises a dynamic setting of the enable signal in the case of a change in registers to be transmitted, and the transmission of the enable signal from the sender side to the receiver side occurs in each case after a change in the registers to be transmitted. Thus, the enable signal can be transmitted, for example, at a system start to the receiver side. Changes in the enable signal are transmitted only as needed. Thereby, the transmission of the enable signal requires only few resources and affects the data throughput or latency only slightly.

In an embodiment of the invention, the transmission of the enable signal from the sender side to the receiver side occurs in a transmission pause in the serial interface. The changes to the enable signal and a change associated therewith in the configuration are therefore carried out when the interface transmits no data in an IDLE mode. Thereby, the transmission of the enable signal requires only few resources and affects the data throughput or latency only slightly.

In the IDLE mode a repeated transmission of the enable signal is also possible in principle, if it has not changed.

In an embodiment of the invention, the method comprises the additional step of adding a generic function block to the sender side and also to the receiver side. Thus, for example, in the FPGA application a blockset "block" is integrated into the model. This block can be kept identical for all specific I/O modules. Optionally, instead of a blockset block, a (V)HDL-IP core is integrated into the (V)HDL source code of a user model or integrated as a netlist into the user design. Further, the function block can be added as a block for graphical programming, as a result of which the programming can be realized in the simple way.

In an embodiment of the invention, the method comprises the additional step of automatically determining a configuration for the adaptive interface. The automatic configuration comprises the maximum number of registers to be transmitted for each FPGA application, and the shared, fixed register width for all registers. Optionally, an automatic configuration for the length of the predefined register section can also occur. The basis for the automatic configuration can be a block size for the transmission of data over the serial interface. It is assured by the automatic configuration that an optimal bandwidth and/or latency are achieved.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
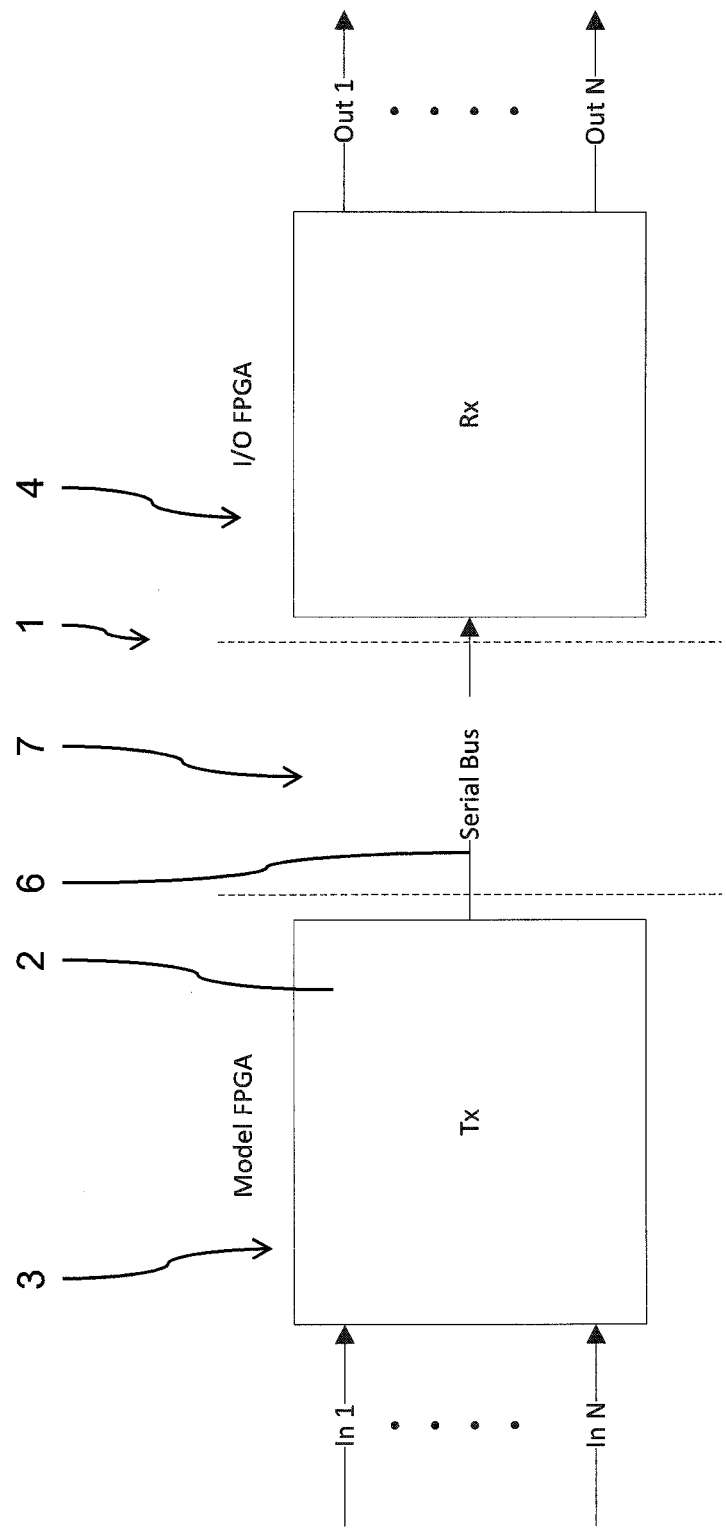
FIG. 1 shows a schematic diagram of an FPGA control system with an FPGA and two I/O modules connected to the FPGA over a serial interface according to an exemplary embodiment.
Figure 2:
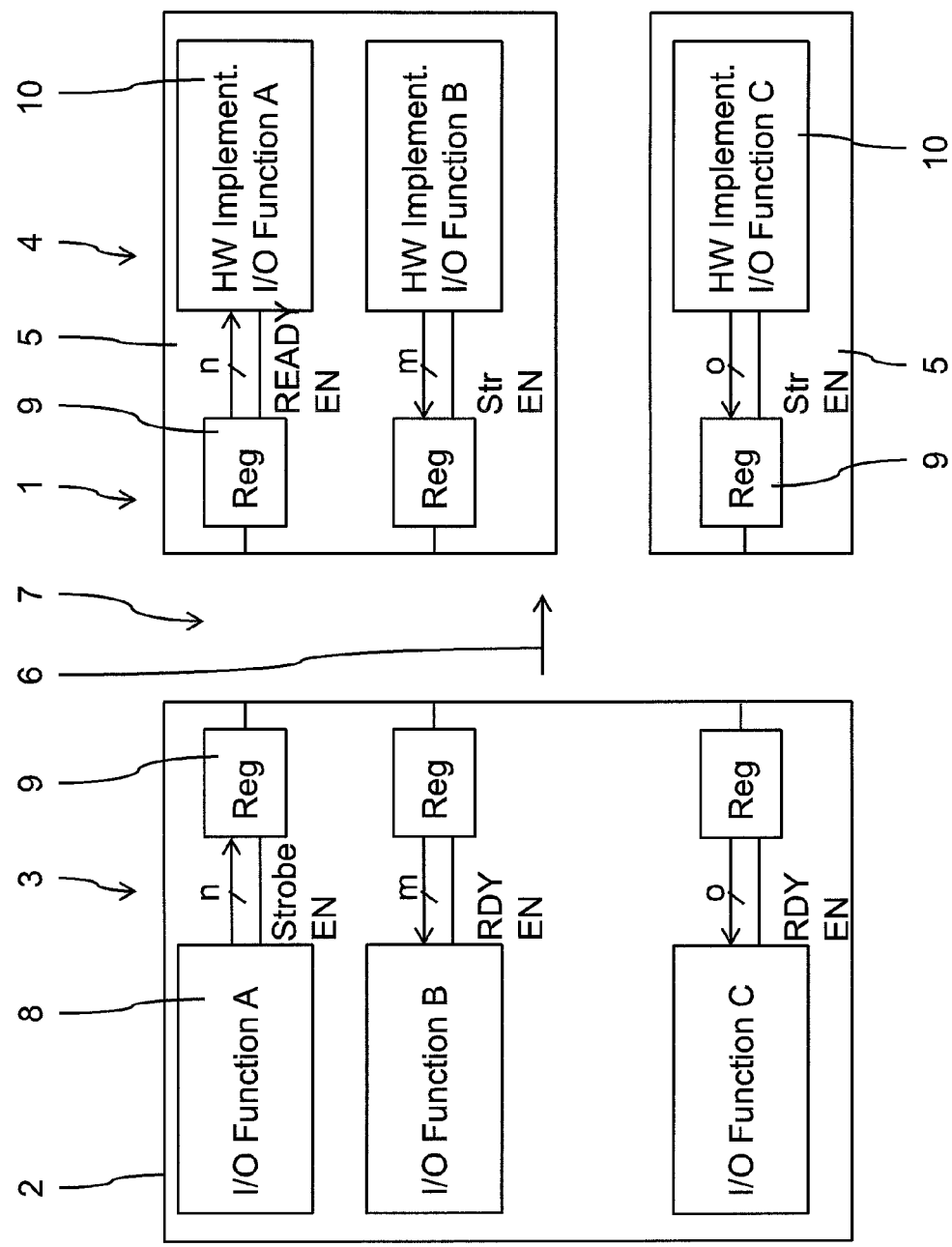
FIG. 2 shows a detailed view of the FPGA control system of FIG. 1.
Figure 3:
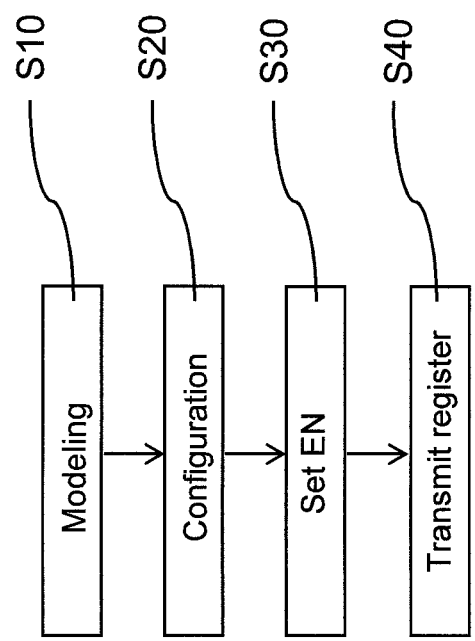
FIG. 3 shows a block diagram of a method according to an exemplary embodiment.

FIG. 1 shows an FPGA control system 1 according to a preferred embodiment. FPGA control system 1 comprises an FPGA 2 as sender side 3 and a receiver side 4. Receiver side 4 in this exemplary embodiment comprises two I/O modules 5, as is shown in the detail in FIG. 2.

A serial interface 6 is formed between sender side 3 and receiver side 4. Serial interface 6 is the basis for an adaptive interface 7, which is implemented between FPGA 2 and I/O modules 5 and uses serial interface 6 as the transmission medium. Serial interface 6 is realized as an LVDS interface with a block size of 8 bits for the transmission of data.

A plurality of FPGA applications 8, each of which is connected via register 9 to adaptive interface 7, is implemented in FPGA 2. On receiver side 4 a plurality of hardware implementations 10 is formed in I/O modules 5, which are also connected via register 9 to adaptive interface 7.

Further, a method for implementing adaptive interface 7 between FPGA 2 and I/O modules 5 is described.

First, in a step S10 a modeling of FPGA applications 8 and hardware implementations 10 is carried out. In this regard, in each case generic function blocks for sender side 3 and for receiver side 4 are integrated as blockset blocks into the particular model. This blockset block is identical for all specific I/O modules 5. The addition of the blockset block occurs as graphical programming.

In a step S20, an automatic determination of a configuration for adaptive interface 7 occurs. The automatic configuration comprises the maximum number of registers 9 to be transmitted for each FPGA application 8, and the shared, fixed register width for all registers 9. The configuration occurs based on the block size for the transmission of data over serial interface 6. In this exemplary embodiment, FPGA applications 8 are realized with n, m, o registers 9, whereby the number n, m, o of register 9 in each case is set to 12 and the register width is selected as 34 bits. Bits used by registers 9 begin with the bit number 0 and are then increasingly occupied up to bit B-1. Unused bits in registers 9 are set to the constant value "zero." The number of registers 9 implemented in FPGA 2 is selected here at the FPGA code generation time according to the requirements of the particular selected I/O function of FPGA applications 8 and I/O modules 5. The number of bits in registers 9 of FPGA applications 8 is thereby equivalent to the inputs (ports) of sender side 3.

In an alternative embodiment, step S20 is carried out before step S10.

In step S30, an enable signal EN is set on sender side 3 for registers 9 to be transmitted out of the maximum number of registers 9 to be transmitted. The enable signal EN is automatically activated in the transmission direction from FPGA application 8 to I/O module 5, as soon as a data channel in the underlying FPGA model is used. In addition, the enable signal EN is transmitted from sender side 3 to receiver side 4 over serial interface 6, as a result of which adaptive interface 7 is initialized. A ready signal RDY, which is implemented as a single bit, is then activated.

In step S40, registers 9, for which enable signal EN is set, are transmitted from sender side 3 to receiver side 4. To this end, first the ready signal RDY is checked. If a transmission is already running, this is indicated by the missing ready signal RDY, and a data transmission is not possible.

As soon as the ready signal RDY is present, the data to be transmitted from the particular FPGA applications 8 are written in registers 9.

The transmission of the data from registers 9 over serial interface 6 is started by FPGA 2 by setting a strobe signal Str. The ready signal RDY is deactivated accordingly. The implementation of strobe Str and ready signal RDY occurs here as a high level, i.e., as a logic one.

Beginning with the strobe signal Str, on sender side 3 the data are read out of registers 9 and transmitted. Next, the data are written on receiver side 4 in the appropriate registers 9. Thereafter, on receiver side 4 a ready signal RDY is provided to indicate that the receiving of registers 9 from the sender side 3 has been completed, and on receiver site 4 each hardware implementation 10 reads the data designated for it from transmitted registers 9.

In the case of changed enable signals EN, these are transmitted to receiver side 4. Otherwise, the transmission of registers 9 occurs directly. In this regard, contents of registers 9 are reduced as described hereafter.

During the transmission of registers 9 from sender side 3 to receiver side 4, it is checked first for each register 9 whether the enable signal EN has been set. If the enable signal EN has not been set, register 9 is not transmitted, and the next register 9 is selected.

Leading zeros are detected as equal leading bits for the remaining registers 9, for which the enable signal EN is set. The equal leading bits are omitted for each register 9 during the transmission. The omission of equal leading bits results in an adjustment of the number of data blocks, to be transmitted, of LVDS interface 6. In the case of a remaining number of 1 to 6 of bits to be transmitted, 1 LVDS data block with 8 bits results, in the case of 7 to 13 bits to be transmitted 2 LVDS data blocks each with 8 bits result, in the case of 14 to 20 bits to be transmitted, 3 LVDS data blocks each with 8 bits result, in the case of 21 to 27 bits to be transmitted 4 LVDS data blocks each with 8 bits result, and in the case of 28 to 34 bits to be transmitted 5 LVDS data blocks each with 8 bits result. In addition, in the LVDS data blocks the information "another packet follows" or "last packet" is transmitted via a defined control bit. Further details will be explained below with reference to FIG. 4.

On receiver side 4, bits that were not received, i.e., the omitted bits, are output as received bits with the value of the equal leading bits, i.e., filled with "zero." If a register 9 contains only the value "zero," the transmission of register 9 is reduced overall to a control structure.

For further transmission of registers 9, on sender side 3 the enable signal EN for registers 9 to be transmitted out of the maximum number of registers 9 to be transmitted can be changed as needed and thereby set dynamically. If the enable signal EN is changed, it is transmitted as described above at the beginning of the transmission of registers 9. Alternatively, the transmission of the enable signal EN from sender side 3 to a receiver side 4 occurs in a transmission pause in serial interface 6, i.e., when serial interface 6 does not transmit any data in an IDLE mode. As a further alternative, in the IDLE mode re-transmission of the present enable signal EN also occurs independent of its alteration.

In an alternative embodiment, in registers 9 changes in the register contents are written as data. A change in a value is signaled as one, and an unchanged bit is set to zero. Otherwise, the method is carried out as described above.

In an alternative embodiment, the above-described reduction of the contents of registers 9 is omitted. In this alternative embodiment, therefore independent of the leading bits, all registers 9, for which the enable signal EN is set, are transmitted. This is signaled via a corresponding control signal for each individual register 9. As a result, a synchronization of the register contents occurs on the sender and receiver side 3, 4. The synchronization occurs periodically. In a further alternative embodiment, the synchronization of the register contents occurs on the sender and receiver side 3, 4 in combination with the previously described transmission of changes in the register contents; i.e., during the transmission of changes of the register contents a synchronization occurs in that the complete register contents are transmitted.

In a further alternative embodiment, in each register 9 the leading bit is set as an unequal bit, therefore to one. This forces the transmission of the entire register 9, so that adaptive interface 7 operates at a constant data rate.

Figure 4:
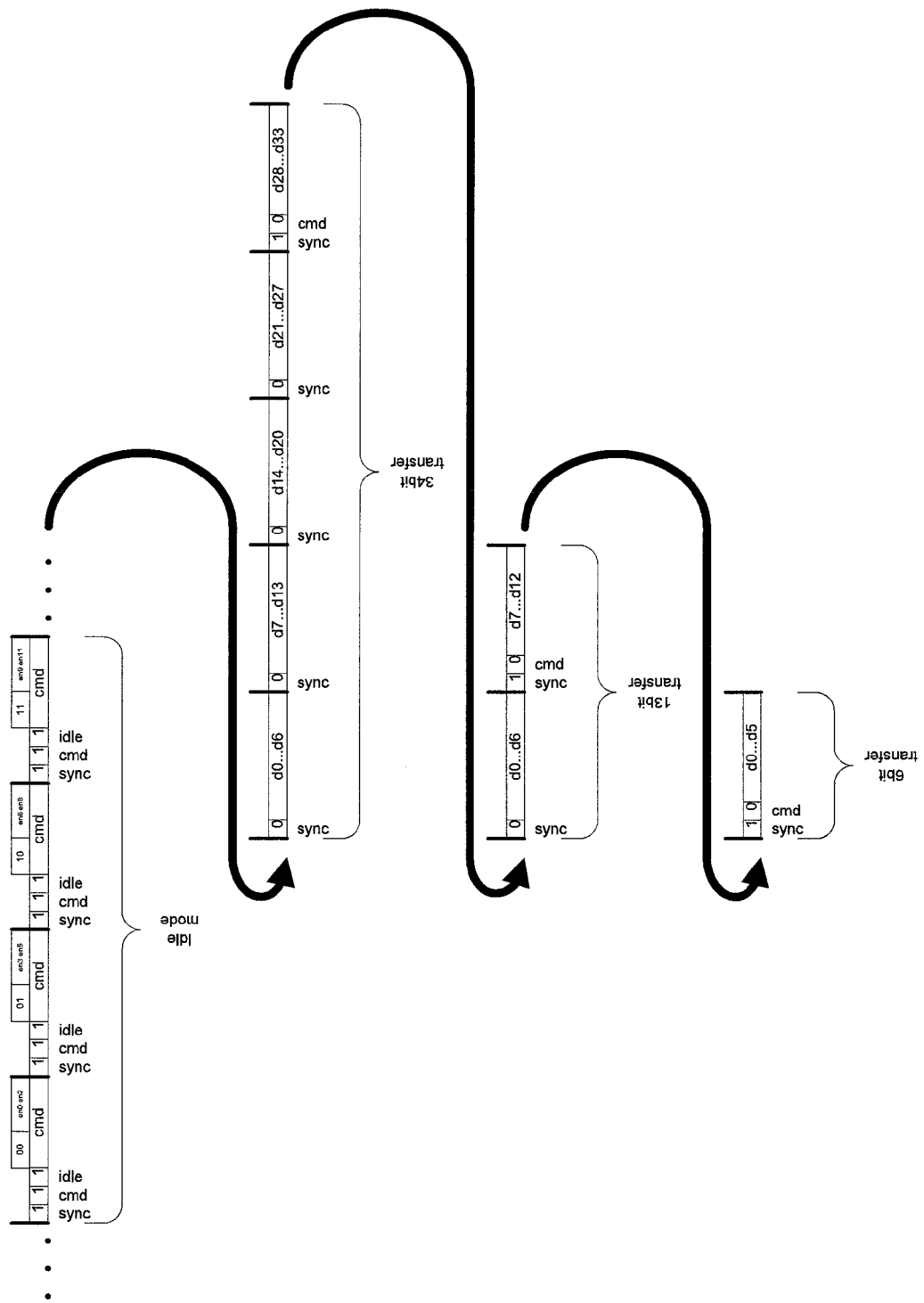
FIG. 4 shows a diagram for illustrating the function of the adaptive interface.

An exemplary data transmission sequence is described below with reference to FIG. 4.

After turning on, serial interface 6 is in the IDLE mode (SYNC=1, CMD=1, IDLE=1). In this mode, the states of the 12 enable signals EN of an FPGA application 8 are transmitted cyclically and without interruption to receiver side 4. The transmission of all 12 bits requires 4 LVDS data blocks each with 8 bits and after turning on must be completed entirely at least once, so that a transmission of registers 9 from sender side 3 to receiver side 4 is initialized.

As soon as strobe signal Str is sent by sender side 2, with the start of the next LVDS data block sender side 3 changes to a transmission mode for the present I/O data in registers 9 (SYNC=0). Now, registers 9 of all input ports beginning with port 1 transmit immediately following each other, whereby the registers for which the enable signal EN is not set are skipped.

The transmission of each register 9 is divided into a maximum of 4×7 bit packets (SYNC=0) plus a final 6 bit packet (SYNC=1, CMD=0) for end detection and begins with the LSB, as described above. After the transmission of a register 9 has been completed, the next register 9 follows immediately without a break.

After all 12 registers 9 have been processed, the controller returns to the IDLE mode (SYNC=1, CMD=1, IDLE=1) and again transmits the states of the ENABLE bit inputs cyclically.

The described exemplary embodiments each relate to FPGA 2 as sender side 3 and I/O modules 5 as receiver side 4. In an alternative embodiment, FPGA 2 forms receiver side 4 and I/O modules 5 sender side 3. In a further alternative embodiment, adaptive interface 7 is realized as a bidirectional interface. Correspondingly, the enable signals EN are set automatically by the implementation of I/O modules 5 in the FPGA model.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for implementing an adaptive interface between at least one FPGA with at least one FPGA application and at least one I/O module, which are designed as a corresponding sender side or receiver side, for connection to the FPGA, wherein a serial interface is formed between the at least one FPGA and the at least one I/O module, the method comprising:
   configuring a maximum number of registers to be transmitted for each FPGA application;
   configuring a shared and/or fixed register width for all registers;
   setting an enable signal on the sender side for the registers to be transmitted out of the maximum number of registers to be transmitted;
   transmitting an enable signal from the sender side to the receiver side; and
   transmitting the registers, for which the enable signal is set, from the sender side to the receiver side.

2. The method according to claim 1, wherein the transmission of the registers, for which the enable signal is set, from the sender side to the receiver side comprises providing a strobe signal on the sender side to indicate that the registers to be transmitted are ready for transmission.

3. The method according to claim 1, wherein the transmission of the registers, for which the enable signal is set, from the sender side to the receiver side comprises providing a ready signal on the sender side to indicate that the transmission of the registers to the receiver side has been completed.

4. The method according to claim 1, wherein the transmission of the registers, for which the enable signal is set, from the sender side to the receiver side comprises providing a ready signal on the receiver side to indicate that the receiving of the registers from the sender side has been completed.

5. The method according to claim 1, wherein the transmission of the registers, for which the enable signal is set, from the sender side to the receiver side comprises the omission of equal leading bits of each register.

6. The method according to claim 5, wherein the omission of equal leading bits of each register comprises the omission of predefined registers sections with equal leading bits.

7. The method according to claim 5, wherein the transmission of the registers, for which the enable signal is set, from the sender side to the receiver side comprises the addition of a leading bit as an unequal bit.

8. The method according to claim 1, wherein the transmission of the registers, for which the enable signal is set, from the sender side to the receiver side comprises the checking of registers, for which the enable signal is set, for changed contents and the transmission of registers with the changed contents.

9. The method according to claim 8, wherein the method comprises the synchronization of register contents on the sender and receiver side.

10. The method according to claim 1, wherein the setting on the sender side of an enable signal for registers to be transmitted out of the maximum number of registers to be transmitted comprises a dynamic setting of the enable signal before the transmission of the registers, and wherein the transmission of the enable signal from the sender side to the receiver side occurs in each case before the transmission of the registers.

11. The method according to claim 1, wherein the setting on the sender side of an enable signal for registers to be transmitted out of the maximum number of registers to be transmitted comprises a dynamic setting of the enable signal in the case of a change in registers to be transmitted, and wherein the transmission of the enable signal from the sender side to the receiver side occurs in each case after a change in the registers to be transmitted.

12. The method according to claim 1, wherein the transmission of the enable signal from the sender side to the receiver side occurs in a transmission pause in the serial interface.

13. The method according to claim 1, further comprising: adding a generic function block to the sender side and to the receiver side.

14. The method according to claim 1, further comprising: automatically determining a configuration for the adaptive interface.

15. An FPGA control system with at least one FPGA with at least one FPGA application and at least one I/O module, which are designed as a corresponding sender side or receiver side for connection to the FPGA, wherein a serial interface is formed between the at least one FPGA and the at least one I/O module, wherein the FPGA control system implements an adaptive interface between the at least one FPGA and the at least one I/O module according to claim 1.

* * * * *